United States Patent
Gil

(10) Patent No.: US 9,300,325 B2
(45) Date of Patent: Mar. 29, 2016

(54) ERROR DETECTION CIRCUIT AND DATA PROCESSING APPARATUS USING THE SAME

(71) Applicant: SK hynix Inc., Icheon-si Gyeonggi-do (KR)

(72) Inventor: Chan Gi Gil, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 115 days.

(21) Appl. No.: 14/092,141

(22) Filed: Nov. 27, 2013

(65) Prior Publication Data
US 2015/0046750 A1    Feb. 12, 2015

(30) Foreign Application Priority Data
Aug. 9, 2013 (KR) .................. 10-2013-0094566

(51) Int. Cl.
*H04L 1/00* (2006.01)
*H03M 13/09* (2006.01)

(52) U.S. Cl.
CPC .................................. *H03M 13/091* (2013.01)

(58) Field of Classification Search
CPC ..................................................... H04L 1/0045
USPC ............................ 714/746, 748, 754, 780, 37
See application file for complete search history.

(56) References Cited

U.S. PATENT DOCUMENTS

| 4,380,812 | A | * | 4/1983 | Ziegler et al. | 714/754 |
| 4,416,010 | A | * | 11/1983 | Hibino | G11B 20/1809 714/755 |
| 5,617,575 | A | * | 4/1997 | Sakakibara et al. | 712/34 |
| 6,473,458 | B1 | * | 10/2002 | Shimizu et al. | 375/240.11 |
| 6,795,941 | B2 | * | 9/2004 | Nickels | 714/706 |
| 7,434,150 | B1 | * | 10/2008 | Barash | H03M 13/091 714/807 |
| 2013/0117640 | A1 | * | 5/2013 | Tai et al. | 714/780 |

FOREIGN PATENT DOCUMENTS

| KR | 100164509 B1 | 9/1998 |
| KR | 101027855 B1 | 3/2011 |

* cited by examiner

*Primary Examiner* — Fritz Alphonse
(74) *Attorney, Agent, or Firm* — William Park & Associates Ltd.

(57) ABSTRACT

An error operation unit configured to output an error detection code in response to a plurality of control signals, a plurality of vectors and data, a vector storage unit configured to store the plurality of vectors, and a vector switching unit configured to provide the plurality of vectors to the error operation unit in response to the plurality of control signals are included.

20 Claims, 8 Drawing Sheets

|  | 1st UI | 2nd UI | 3rd UI | 4th UI | 5th UI | 6th UI | 7th UI | 8th UI |
|---|---|---|---|---|---|---|---|---|
| CRC[0] | 0125678 | 6 | 2468 | 2458 | 13678 | 2568 | 0136 | 02347 |
| CRC[1] | 023467 | 012578 | 248 | 56 | 1234567 | 12357 | 012358 | 12467 |
| CRC[2] | 0136 | 02347 | 014567 | 5 | 13578 | 13478 | 02567 | 14578 |
| CRC[3] | 2568 | 0136 | 02347 | 014567 | 5 | 13578 | 13478 | 02567 |
| CRC[4] | 13678 | 2568 | 0136 | 02347 | 014567 | 5 | 13578 | 13478 |
| CRC[5] | 2458 | 13678 | 2568 | 0136 | 02347 | 014567 | 5 | 13578 |
| CRC[6] | 2468 | 2458 | 13678 | 2568 | 0136 | 02347 | 014567 | 5 |
| CRC[7] | 6 | 2468 | 2458 | 13678 | 2568 | 0136 | 02347 | 014567 |

FIG.3

|  | 1st UI | 2nd UI | 3rd UI | 4th UI | 5th UI | 6th UI | 7th UI | 8th UI |
|---|---|---|---|---|---|---|---|---|
| CRC[0] | 111001111 | 000000100 | 001010101 | 001011001 | 010100111 | 001001101 | 110100100 | 101110010 |
| CRC[1] | 101110010 | 111001011 | 001010001 | 000001100 | 011111110 | 011101010 | 111101001 | 010101010 |
| CRC[2] | 110100100 | 101110010 | 110011110 | 000001000 | 010101011 | 010110011 | 101001110 | 010011011 |
| CRC[3] | 001001101 | 110100100 | 101110010 | 110011110 | 000001000 | 010101011 | 010110011 | 101001110 |
| CRC[4] | 010100111 | 001001101 | 110100100 | 101110010 | 110011110 | 000001000 | 010101011 | 010110011 |
| CRC[5] | 001011001 | 010100111 | 001001101 | 110100100 | 101110010 | 110011110 | 000001000 | 010101011 |
| CRC[6] | 001010101 | 001011001 | 010100111 | 001001101 | 110100100 | 101110010 | 110011110 | 000001000 |
| CRC[7] | 000000100 | 001010101 | 001011001 | 010100111 | 001001101 | 110100100 | 101110010 | 110011110 |

FIG.4

| | 1st UE | 2nd UE | 3rd UE | 4th UE | 5th UE | 6th UE | 7th UE | 8th UE |
|---|---|---|---|---|---|---|---|---|
| CRC[0] | v(0) | v(1) | v(2) | v(3) | v(4) | v(5) | v(6) | v(7) |
| CRC[7] | v(1) | v(2) | v(3) | v(4) | v(5) | v(6) | v(7) | v(8) |
| CRC[6] | v(2) | v(3) | v(4) | v(5) | v(6) | v(7) | v(8) | v(9) |
| CRC[5] | v(3) | v(4) | v(5) | v(6) | v(7) | v(8) | v(9) | v(10) |
| CRC[4] | v(4) | v(5) | v(6) | v(7) | v(8) | v(9) | v(10) | v(11) |
| CRC[3] | v(5) | v(6) | v(7) | v(8) | v(9) | v(10) | v(11) | v(12) |
| CRC[2] | v(6) | v(7) | v(8) | v(9) | v(10) | v(11) | v(12) | v(13) |
| CRC[1] | v(14) | v(15) | v(16) | v(17) | v(18) | v(19) | v(20) | v(21) |

ERROR DETECTION CIRCUIT AND DATA PROCESSING APPARATUS USING THE SAME

CROSS-REFERENCES TO RELATED APPLICATION

The present application claims priority under 35 U.S.C. §119(a) to Korean application number 10-2013-0094566, filed on Aug. 9, 2013, in the Korean Intellectual Property Office, which is incorporated herein by reference in its entirety.

BACKGROUND

1. Technical Field

Various embodiments relate to a data processing apparatus, and more particularly, to an error detection circuit and a data processing apparatus using the same.

2. Related Art

A data processing apparatus includes an error detection circuit to detect whether or not an error has occurred through a series of data operations in preparation for input/output error probability of data.

A cyclic redundancy check (CRC) is a kind of error detection circuit.

An error detection circuit detects whether or not an error has occurred through an operation, e.g. an XOR operation, of data bits of predetermined input/output units, wherein the XOR operation precedes a procedure of receiving all the data bits (e.g. 72 bits) of predetermined input/output units. In addition, a logic circuit for performing the XOR operation is also required.

Accordingly, in the conventional error detection circuit, a circuit area and a signal processing load increases because a logic circuit which performs an error detection operation needs to accommodate all the data bits of predetermined input/output units.

In addition, in view of a data processing apparatus using the conventional error detection circuit, the layout margin thereof is reduced due to a global line wiring for transmitting all the data bits of the input/output units to an error detection circuit.

SUMMARY

An error detection circuit capable of reducing a circuit area and a signal processing load, and a data processing apparatus using the same are described herein.

In an embodiment of the present invention, an error detection circuit can include: an error operation unit configured to output an error detection code in response to a plurality of control signals, a plurality of vectors and data; a vector storage unit configured to store the plurality of vectors; and a vector switching unit configured to provide the plurality of vectors to the error operation unit in response to the plurality of control signals.

In an embodiment of the present invention, an error detection circuit can include: a vector storage unit configured to store a plurality of vectors; a vector switching unit configured to sequentially shift the plurality of vectors on the basis of numbers and to output shifted vectors as many as a predetermined number according to a unit interval which defines a data input interval; and a plurality of operation units configured to output an error detection code in response to data and each of vectors provided from the vector switching unit.

In an embodiment of the present invention, a data processing apparatus can include: a storage unit; a data processing control unit configured to control data write/read operations with respect to the storage unit; and an error detection circuit configured to generate an error detection code in response to a plurality of vectors and data.

In an embodiment of the present invention, the data processing control unit can be configured to generate and provide an error alert signal to an external device when the error detection code has a value which defines an error occurrence.

In an embodiment of the present invention, the data processing apparatus can further include an interface unit for generating parallel data by parallelizing serial data provided from an exterior.

In an embodiment of the present invention, the data processing apparatus can further include: a plurality of first global lines configured to transmit the parallel data to the data processing control unit; and a plurality of second global lines configured to transmit a portion of the parallel data, as the data, to the error detection circuit.

BRIEF DESCRIPTION OF THE DRAWINGS

Features, aspects, and embodiments are described in conjunction with the attached drawings, in which:

FIG. 1 illustrates an error detection operation table for explaining an error detection implementation principle according to one embodiment;

FIG. 2 illustrates a table in which data used for an operation in the table of FIG. 1 is shown with respect to unit intervals;

FIG. 3 illustrates a table in which used data and unused data in the table of FIG. 2 are substituted by "1" and "0";

FIG. 4 illustrates a table in which the table of FIG. 3 is expressed with vectors;

DETAILED DESCRIPTION

Figure 5:
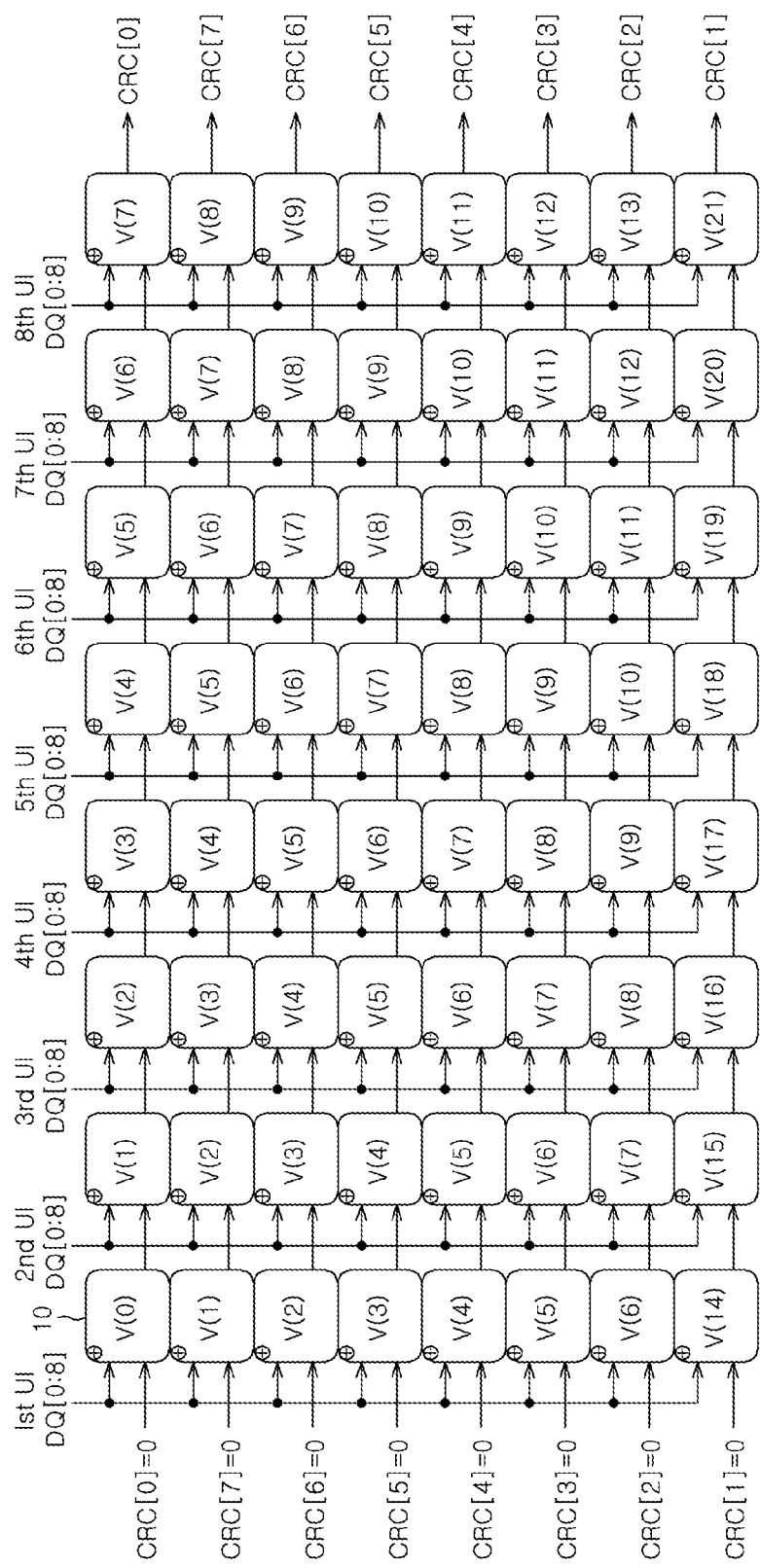
FIG. 5 is a conceptual view of an error detection circuit according to the vector table of FIG. 4.

Hereinafter, an error detection circuit and a data processing apparatus using the same according to embodiments of the present invention will be described below with reference to the accompanying drawings through example embodiments.

Referring to FIGS. 1 to 6, an implementation principle of error detection according to embodiments of the present invention will be described below.

Figure 1:
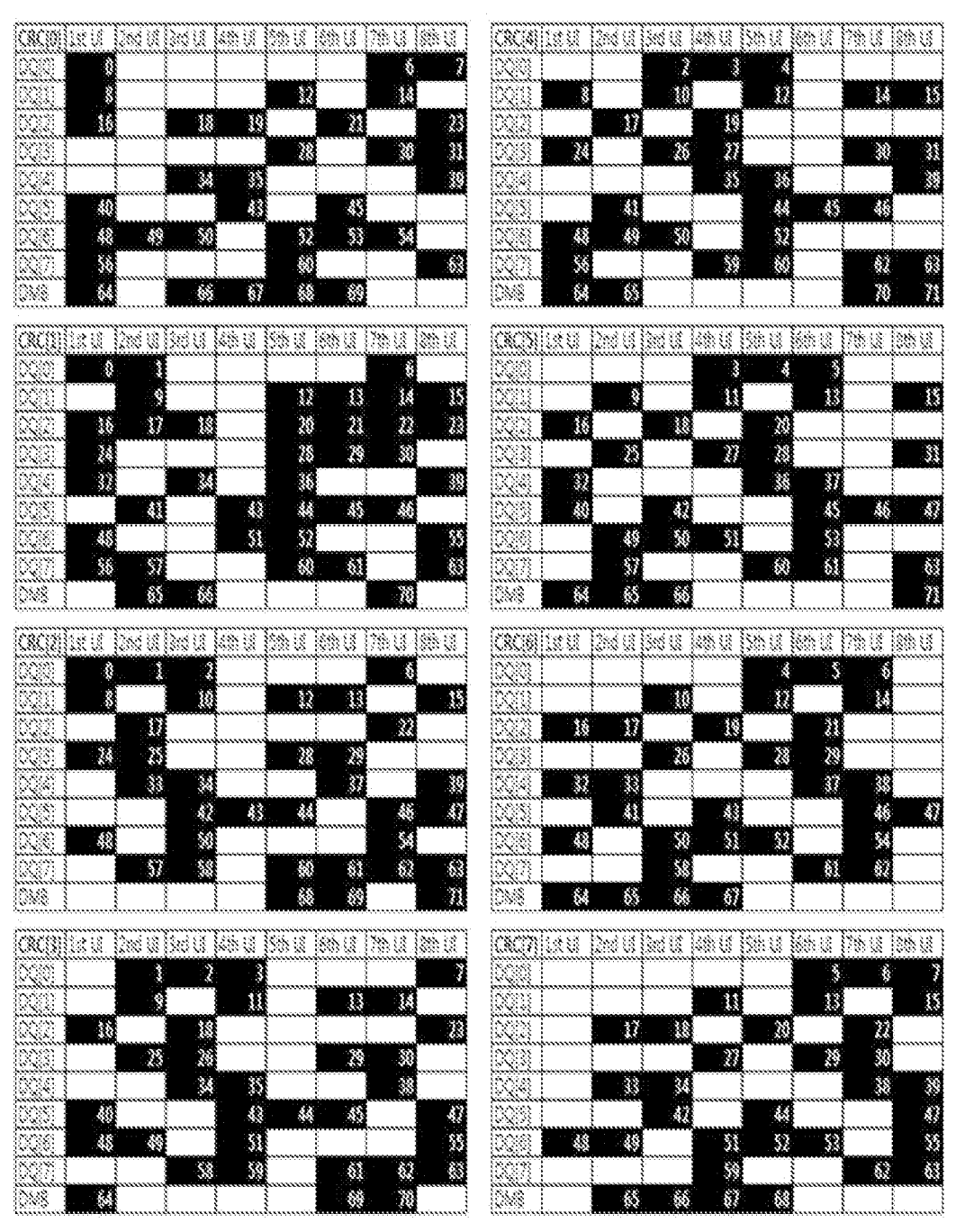

When it is assumed that data of "0-71" is inputted through input/output pads (e.g. DQ0-7 and DMB), a method of generating the respective error detection codes CRC[0:7] can be achieved by performing an error detection operation (e.g. an XOR operation) on data of portions in which numerals are expressed in each table of FIG. 1.

In this case, the DMB can be a pad for defining whether data corresponds to a data mask.

FIG. 1 illustrates one way of expressing DQ numbers required at every unit interval (UI). FIG. 2 illustrates another expression of the DQ numbers of FIG. 1 in a tabular form.

For example, data required for generating an error detection code CRC[0] of a first UI on the basis of FIG. 1 may be expressed as "0, 8, 16, 40, 48, 56 and 64". When the data is expressed in terms of DQ numbers, the data can be expressed as "0125678" as shown in FIG. 2. When the data is expressed in terms of DQ numbers, DQ<8> may correspond to the DMB.

When data used for an error detection operation in FIG. 2 is expressed as "1", and data unused for the error detection operation is expressed as "0", a result thereof can be expressed in the form of a table as shown in FIG. 3.

The values of table of FIG. 3 can be interpreted as vectors for the respective error detection codes CRC[0:7] according to unit intervals.

A total of 64 vectors exist in the table of FIG. 3. Some of the vectors among the 64 vectors may have the same value.

For example, a vector for generating an error detection code CRC[7] in a first UI and a vector for generating an error detection code CRC[0] in a second UI may have the same value of "000000100". Also, a vector for generating an error detection code CRC[6] in a first UI, a vector for generating an error detection code CRC[7] in a second UI, and a vector for generating an error detection code CRC[0] in a third UI may have the same value of "001010101".

The error detection codes CRC[0:7] of the table shown in FIG. 3 are depicted in an numerically ascending order. That is, CRC[0], CRC[1], etc. When the positions of the error detection codes CRC[0:7] shown in FIG. 3 are changed to CRC[0, 7-1], the error detection codes are arranged to 22 kinds of vectors V(0)-V(21), which have a structure in which vectors having the same value are arranged in a diagonal direction.

The aforementioned error detection operation scheme is explained with an example of an ATM HEC-8 scheme. However, since other types of error detection operation schemes are also based on the same division operation as the aforementioned ATM HEC-8 scheme, the same vectors exist, so that a structure having a form similar to that shown in FIG. 4 will appear.

When a vector table as shown in FIG. 4 described above is implemented in the form of an error detection circuit, a result thereof can be configured as shown in FIG. 5.

That is to say, referring to FIG. 5, a plurality of operation units 10 can be arranged in sequence with respect to unit intervals.

Each of the plurality of operation units 10 can include vectors V(0)-V(21) according to the vector table of FIG. 4. In this case, the vectors V(0)-V(21) can be included therein, or can be provided from an exterior.

Each of the plurality of operation units 10 performs an error detection operation using data corresponding to a vector thereof among input data DQ<0:8>, and transmits a result thereof to the next stage.

When the plurality of operation units 10 are arranged and operate as shown in FIG. 5, the plurality of operation units 10 corresponding to a first input stage can receive error detection codes CRC[0:7] having a value of "0".

The plurality of operation units 10 perform error detection operations in sequence in units of unit intervals, and output a result of the operation on data DQ<0:8> corresponding to the last unit interval, i.e. the eighth UI, as the final error detection codes CRC[0:7].

Figure 6:
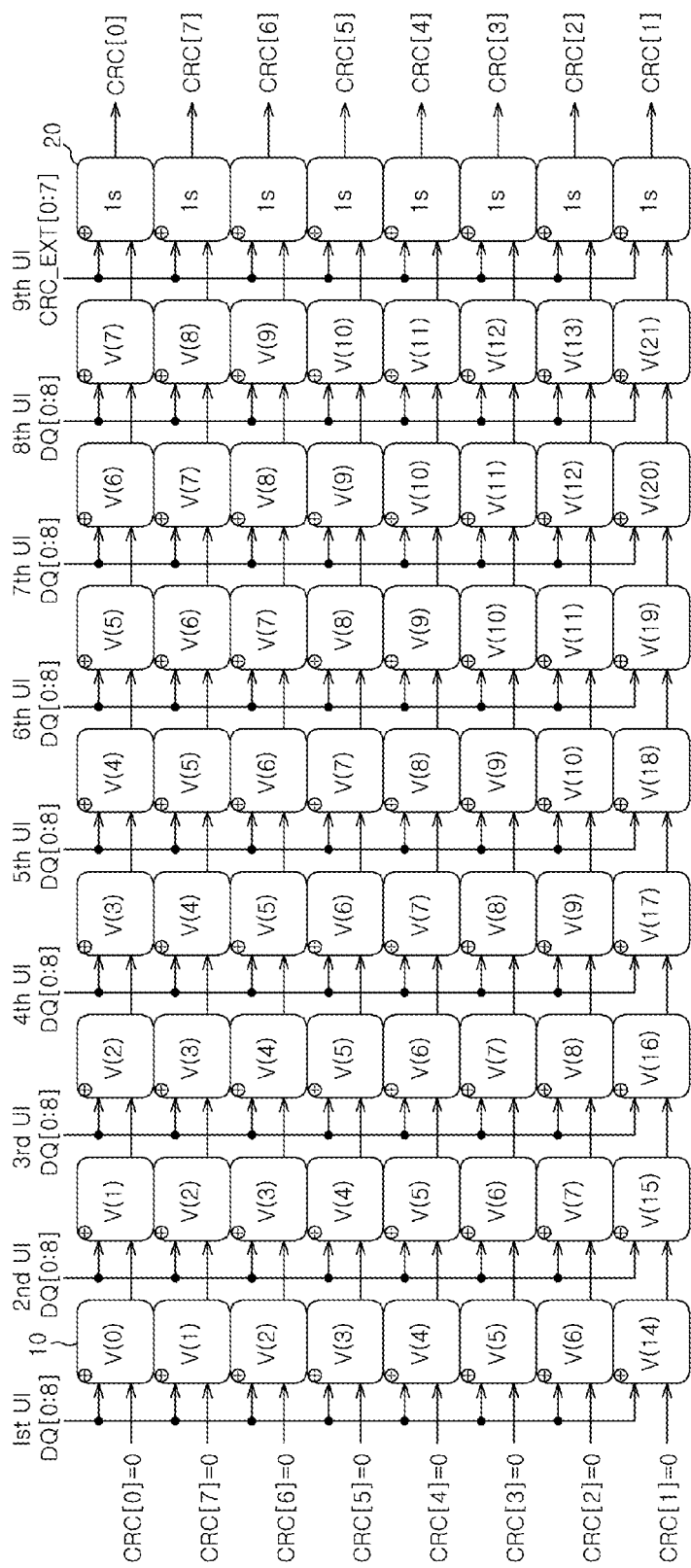
FIG. 6 is a conceptual view of an error detection circuit when an error detection code is provided from an exterior with respect to the vector table of FIG. 4.

When external error detection codes CRC_EXT[0:7] are inputted in a ninth UI and the vector table as shown in FIG. 4 is implemented in the form of an error detection circuit, a result thereof can be configured as shown in FIG. 6.

When external error detection codes CRC_EXT[0:7] are inputted in a ninth UI to an error detection circuit as shown in FIG. 6, the external error detection codes CRC_EXT[0:7] can be provided from an external device which performs data communication with a data processing apparatus to which an error detection circuit is applied.

That is to say, referring to FIG. 6, a plurality of operation units 10 can be arranged in sequence with respect to unit intervals.

The last stage depicts an arrangement of a plurality of operation units 20. The plurality of operations units of the last stage may receive an error detection operation value of a previous stage and external error detection codes CRC_EXT[0:7] provided in the ninth UI.

Each of the plurality of operation units 10 can include at least one of the vectors V(0)-V(21) according to the vector table of FIG. 4. In this case, the vectors V(0)-V(21) can be included therein, or can be provided from an exterior.

The plurality of operation units 20 can include a vector "1S" all the values of which are "1".

Each of the plurality of operation units 10 performs an error detection operation using data corresponding to a vector thereof among input data DQ<0:8>, and transmits a result thereof to the next stage.

In this case, the plurality of operation units 10 corresponding to a first input stage can receive error detection codes CRC[0:7] having a value of "0".

The plurality of operation units 10 perform error detection operations in sequence in units of unit intervals, and output a result of the operation on the data DQ<0:8> corresponding to the last unit interval, i.e. the eighth UI, to the plurality of operation units 20.

Each of the plurality of operation units 20 performs an operation on the error detection operation result outputted from the plurality of operation units 10 and all bits of the external error detection codes CRC_EXT[0:7], and the plurality of operation units 20 outputs a result of the operation as final error detection codes CRC[0:7].

As shown in FIGS. 1 to 6 and described above, each of the error detection codes CRC[0:7] may include a structure in which a vector is shifted, the vector may be required at every unit interval.

That is to say, in the case of the error detection code CRC[0], a required vector increases in a sequence of V(0), V(1), V(2), ..., V(7) as the unit intervals progress; in the case of the error detection code CRC[7], a required vector increases in a sequence of V(1), V(2), V(3), ..., V(8) as the unit intervals progress; and in the case of the error detection code CRC[2], a required vector increases in a sequence of V(6), V(7), V(8), ..., V(13) as the unit intervals progress.

Therefore, according to embodiments of the present invention, an error detection circuit can be configured to share operation units by shifting and providing vectors required in the operation units at every unit interval, which will be described later.

Figure 7:
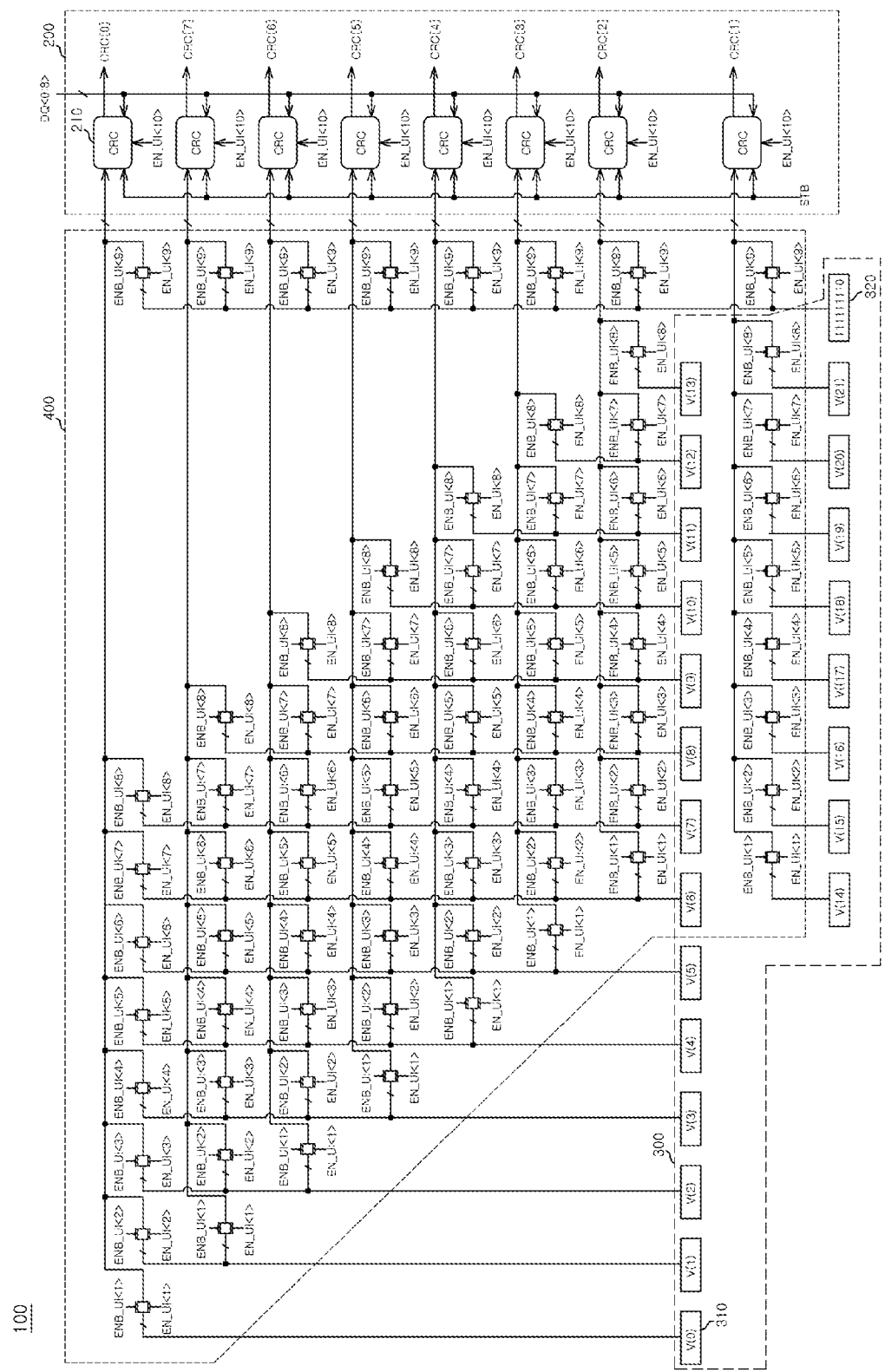
FIG. 7 is a circuit diagram illustrating a configuration of an error detection circuit according to one embodiment.

Referring to FIG. 7, an error detection circuit 100 according to an embodiment of the present invention will be described below.

As shown in FIG. 7, the error detection circuit 100 according to an embodiment of the present invention can include an error operation unit 200, a vector storage unit 300 and a vector switching unit 400.

The error operation unit 200 can be configured to output error detection codes CRC[0:7] in response to: a plurality of control signals; a plurality of vectors which may include one or more vectors provided from an exterior; and data DQ<0:8>.

The plurality of control signals can include a strobe signal STB and a timing control signal EN_UI<10>.

The error operation unit 200 can be configured to perform an error detection operation on at least a portion of data DQ<0:8> corresponding to a plurality of vectors which may include one or more vectors provided from an exterior, where the error detection operation may be performed at every activation timing of the strobe signal STB.

The error operation unit 200 can be configured to output, as error detection codes CRC[0:7], a result of an error detection operation at an activation timing of the timing control signal EN_UI<10>.

The error operation unit 200 can include a plurality of operation units 210.

Each of the plurality of operation units 210 can receive a strobe signal STB, a timing control signal EN_UI<10> and data DQ<0:8>.

The plurality of operation units 210 may be configured to sequentially receive vectors, from among the plurality of vectors V(0)-V(21), where each received vector may have a different value.

The vector storage unit 300 can include a plurality of unit-vector units 310 which store vectors V(0)-V(21), respectively.

The vector storage unit 300 can include a unit-vector unit 320 which stores a vector having the value "11111110" that may be used in an operation with an external error detection code (corresponding to the CRC_EXT[0:7] of FIG. 6).

When external error detection codes CRC_EXT[0:7] (see FIG. 6) is provided, the external error detection codes CRC_EXT[0:7] can be provided as data DQ<0:8> at the last timing unit interval UI, where the last timing unit interval UI may correspond to the ninth UI.

Therefore, in order to perform an error operation with the external error detection codes and a previous error operation result, the vector "11111110" configured such that eight bits have a value of "1" can be used and the last bit has a value of "0". The unit-vector unit 320 can be configured to store the vector "11111110".

The vector switching unit 400 can be configured to provide the vectors V(0)-V(21) and the vector "11111110" to the error operation unit 200 in response to timing control signals EN_UI<1:9>.

ENB_UI<1:9> are signals obtained by reversing the timing control signals EN_UI<1:9>, respectively.

The vector switching unit 400 can be configured to provide selected vectors to the error operation unit 200 in response timing control signals EN_UI<1:9>. For example, the vector switching unit 400 may provide the selected vectors from among the vectors V(0)-V(21) and the vector "11111110" in sequence to the error operation unit 200 every activation timing of the respective timing control signals EN_UI<1:9>. As previously described, the error detection circuit may be configured to share operation units by shifting and providing vectors required in the operation units at every unit interval. Accordingly, the vector switching unit 400 may be configured to sequentially shift the plurality of vectors V(0)-V(21) on the basis of numbers and to output a predetermined number of shifted vectors according to a unit interval. The number may serve, in one example, as an index into the vectors V(0)-V(21).

The vector switching unit 400 can include a plurality of switches.

The plurality of switches can be configured with pass gates, respectively.

Each of the plurality of switches can be configured such that an input terminal thereof is electrically coupled to one of the unit-vector unit 320 and at least one of the plurality of unit-vector units 310. An output terminal of each of the plurality of switches may be electrically coupled to one of the plurality of operation units 210. Also, a control terminal of each of the plurality of switches may be electrically coupled to receive one of the timing control signals EN_UI<1:9>.

A strobe signal STB and timing control signals EN_UI<1:10> can be generated based on a signal representing an input timing of data DQ<0:8>, i.e. a signal which can be used as a reference for the timing of the aforementioned unit interval (UI), e.g. a data strobe signal DQS. In other words, the plurality of timing control signals EN_UI<1:10> may be activated in sequence in units of unit intervals (UI) which define input intervals of the data DQ<0:8>. The plurality of timing control signals EN_UI<1:10> may be generated based on the data strobe signal DQS.

When the strobe signal STB and timing control signals EN_UI<1:10> are generated based on the data strobe signal DQS, a unit interval can be one half cycle time ½ tCK of a clock signal.

For example, timing control signals EN_UI<1:10> may be activated for predetermined time periods, respectively. The timing control signals EN_UI<1:10> may be generated on the basis of a toggle generation of a data strobe signal DQS.

A strobe signal STB also can be generated to be activated with a time difference from the toggle generation of the data strobe signal DQS.

Since the strobe signal STB is a signal for an error detection operation of a plurality of operation units 210, the strobe signal STB can be delayed by a predetermined time period in comparison with the timing control signals EN_UI<1:10>.

The strobe signal STB and the timing control signals EN_UI<1:10> can be generated in the error detection circuit 100, or can be provided from an exterior to be used.

Figure 8:
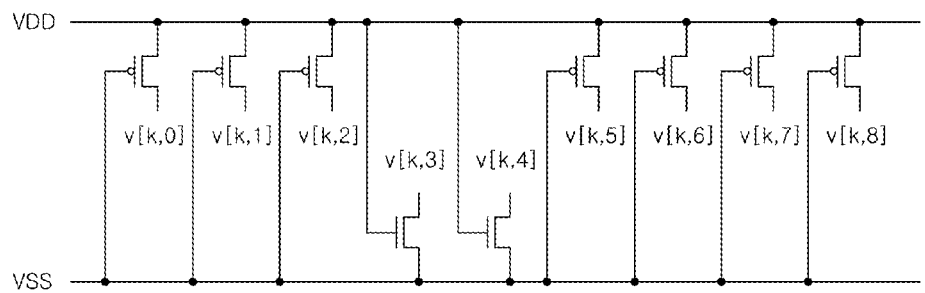
FIG. 8 is a circuit diagram illustrating a configuration of a unit-vector unit shown in FIG. 7.

As shown in FIG. 8, the plurality of unit-vector units 310 and the unit-vector unit 320 can be configured with a plurality of transistors which are electrically coupled between a power supply terminal VDD and a ground terminal VSS.

When the plurality of unit-vector units 310 are configured as shown in FIG. 8, segment vectors constituting each of the vectors V(0)-V(21) are defined to be v[k,0]-v[k,8].

For example, referring to FIG. 3, segment vectors v[k,0]-v[k,8] constituting the vector V(0) have values of "111001111". Thus, v[0,0] may have the value "1", v[0,1] may have the value "1", v[0,2] may have the value "1", v[0,3] may have the value "0", etc.

When the transistors of the unit-vector units 310 and the unit-vector unit 320 are configured as shown in FIG. 8, the value of "1" can be made by electrically coupling the source of a PMOS transistor to the power supply terminal VDD and electrically coupling the gate thereof to the ground terminal VSS to output a logic high value "1" through the drain thereof.

In addition, the value of "0" can be made by electrically coupling the source of an NMOS transistor to the ground terminal VSS and electrically coupling the gate thereof to the power supply terminal VDD to output a logic low value "0" through the drain thereof.

The plurality of unit-vector units 310 and the unit-vector unit 320 can be configured in the manner described above, such that each unit-vector unit from among the plurality of unit-vector units 310 may accord with the respective values of segment vectors v[k,0]-v[k,8] constituting a vector V(0)-V(21) stored in a unit-vector unit.

Figure 9:
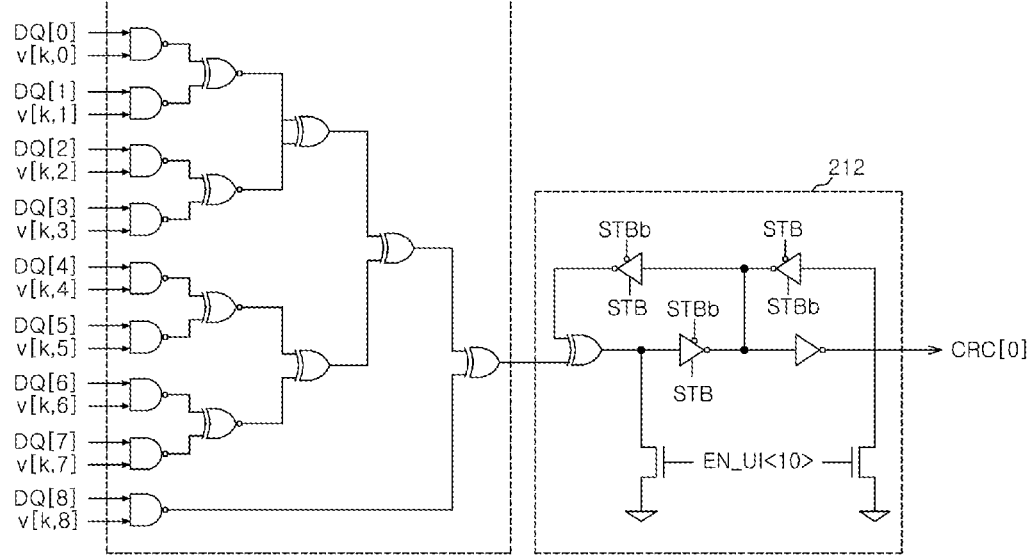
FIG. 9 is a circuit diagram illustrating a configuration of a operation unit shown in FIG. 7.

As shown in FIG. 9, the operation unit 210 can include an operation unit 211 and a latch unit 212.

The operation unit 211 can include a plurality of logic gates, i.e. NAND gates, XOR gates and XNOR gates, configured to perform an error detection operation on a portion of data DQ<0:8> which has the same numbers as segment vectors having a value of "1" among the segment vectors v[k,0]-v[k,8]. Thus, for example, if the number is "0", and v[0,0] has a value of "1", then an error operation may be performed on v[0,0] and DQ<0>; if the number is "1", and v[1,0] has a value of "0", then an error operation is not performed on v[1,0] and DQ<1>.

The operation unit 211 can output a value of "0" when an error is not detected as a result of an error detection operation, and output a value of "1" when an error is detected.

The latch unit 212 can include an XOR gate, a plurality of tri-state inverters, an inverter, and a plurality of transistors so as to latch and output an operation result of the operation unit 211 as an error detection code (e.g. CRC[0]) in response to the strobe signal STB and the timing control signal EN_UI<10>.

The latch unit 212 updates and latches an operation result of the operation unit 211 whenever the strobe signal STB is activated.

The latch unit 212 outputs an error detection code CRC[0] as "0" (normal) or "1" (error detection) depending on whether a final operation result is "0" in response to the activation of the timing control signal EN_UI<10>.

Figure 10:
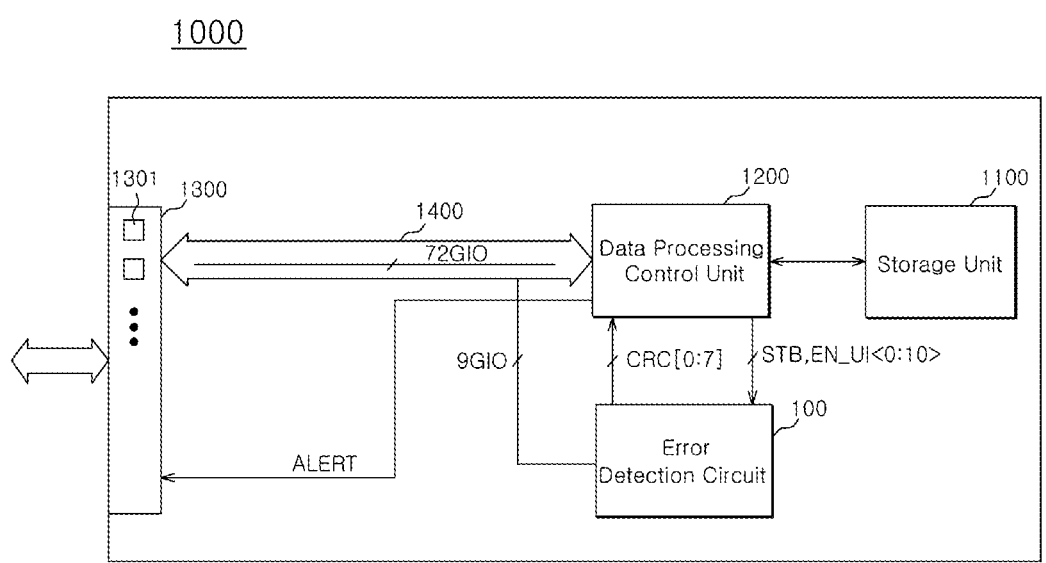
FIG. 10 a block diagram illustrating a configuration of a data processing apparatus according to one embodiment.

As shown in FIG. 10, a data processing apparatus 1000 according to an embodiment of the present invention can include an error detection circuit 100, a storage unit 1100, a data processing control unit 1200, an interface unit 1300, and a bus line 1400.

The interface unit 1300 can be configured to perform a series of processes, e.g. signal level adjustment, timing adjustment, and/or data serialization/parallelization, on commands, addresses and data so as to be able to process the commands, addresses and data therein.

The interface unit 1300 can include components relating to signal input/output interface, e.g. a command decoder, a data serialization/parallelization device, and the like. The interface unit 1300 may be configured to generate parallel data by parallelizing serial data provided from an exterior.

The interface unit 1300 can include pads 1301 for the input/output of signals, i.e. commands, addresses, and/or data.

The bus line 1400 can include a signal line and the like for transmitting commands, addresses, and/or data, which have passed through the interface unit 1300, to the data processing control unit 1200.

The bus line 1400 can include a signal line for receiving a data strobe signal DQS from an external device through the interface unit 1300.

In this case, a signal line for data communication can include, for example, 72 global input/output lines "72GIO" with respect to data DQ<0:8> shown in FIG. 3.

The error detection circuit 100 can be configured as described with reference to FIGS. 1 to 9.

The error detection circuit 100 may perform an error detection operation in sequence with respect to data in units of unit intervals, as opposed to performing error detection operations on the entire data bits "72". Because the error detection circuit 100 performs error detection operations in unit intervals, the error detection circuit 100 can be electrically coupled to 9 global input/output lines 9GIO of 72 global input/output lines 72GIO. In one embodiment, the 72 global input/output lines 72GIO may be configured into a plurality of first global lines and a plurality of second global lines. The plurality of first global lines may be configured to transmit parallel data to the data processing control unit 1200. The second plurality of global lines may be configured to transmit a portion of the parallel data, as data, for example DQ<0:8>, to the error detection circuit 100.

The error detection circuit 100 can provide the data processing control unit 1200 with error detection codes CRC[0:7] generated by an error detection operation.

The storage unit 1100 can be configured to store data provided from an exterior.

The storage unit 1100 can be configured with a volatile memory or a non-volatile memory, or can be configured with both thereof.

The data processing control unit 1200 can be configured to control the data write/read operations with respect to the storage unit 1100 in response to commands and addresses which are provided through the interface unit 1300 via the bus line 1400 from an external device.

The data processing control unit 1200 can be configured to generate a strobe signal STB and timing control signals EN_UI<1:10> according to a data strobe signal DQS provided from an external device, and the data processing control unit 1200 may be configured to provide the generated strobe signal STB and timing control signals EN_UI<1:10> to the error detection circuit 100.

When an error detection code CRC[0:7] has a value which defines an error occurrence, the data processing control unit 1200 can generate and provide an error alert signal ALERT to an external device through the input/output pad unit 1301.

The present invention can reduce a circuit area and signal load through the simplified error detection operation.

While certain embodiments have been described above, it will be understood to those skilled in the art that the embodiments described are by way of example only. Accordingly, the circuit and apparatus described herein should not be limited based on the described embodiments. Rather, the circuit and apparatus described herein should only be limited in light of the claims that follow when taken in conjunction with the above description and accompanying drawings.

What is claimed is:

1. An error detection circuit comprising:
an error operation unit configured to output an error detection code by perform an error detection operation on data using a plurality of vectors;
a vector storage unit configured to store the plurality of vectors; and
a vector switching unit configured to provide the plurality of vectors to the error operation unit according to a plurality of control signals,
wherein the error operation unit is configured to perform the error detection operation on a portion of data corresponding to the plurality of vectors provided from an exterior of the error detection circuit at every activation timing of one of the plurality of control signals.

2. The error detection circuit according to claim 1, wherein the plurality of control signals are activated in sequence in units of unit intervals (UI) which define input intervals of the data.

3. The error detection circuit according to claim 1, wherein the plurality of control signals are generated on the basis of a data strobe signal DQS.

4. The error detection circuit according to claim 1, wherein the error operation unit comprises a plurality of operation units, and the plurality of operation units are configured to sequentially receive different vectors among the plurality of vectors where the received vectors have a different value.

5. The error detection circuit according to claim 1, wherein the error operation unit comprises a plurality of operation units, and each of the plurality of operation units is configured to perform the error detection operation on a portion of data which has numbers identical to those of segment vectors having a value of "1" among segment vectors constituting a vector provided to the operation unit.

6. The error detection circuit according to claim 1, wherein the error operation unit comprises a plurality of operation units, wherein each of the plurality of operation units comprises:
  an operation unit configured to perform the error detection operation on a portion of data which has numbers identical to those of segment vectors having a value of "1" among segment vectors constituting a vector provided to the operation unit; and
  a latch unit configured to latch and output an operation result of the operation unit as the error detection code in response to the plurality of control signals.

7. The error detection circuit according to claim 1, wherein the vector storage unit comprises a plurality of unit-vector units for storing the plurality of vectors, respectively.

8. The error detection circuit according to claim 7, wherein each unit-vector unit comprises a plurality of transistors which are electrically coupled between a power supply terminal and a ground terminal so as to accord with the respective values of segment vectors constituting a vector stored in the unit-vector unit.

9. The error detection circuit according to claim 1, wherein the vector switching unit comprises a plurality of switches which are configured to provide the error operation unit with the plurality of vectors in sequence in predetermined units in response to activation of each of the plurality of control signals.

10. An error detection circuit comprising:
  a vector storage unit configured to store a plurality of vectors;
  a vector switching unit configured to sequentially shift the plurality of vectors on the basis of numbers and to output shifted vectors as many as a predetermined number according to a unit interval which defines a data input interval; and
  a plurality of operation units configured to output an error detection code by perform an error detection operation on data using each of vectors provided from the vector switching unit.

11. The error detection circuit according to claim 10, wherein:
  the vector storage unit comprises a plurality of unit-vector units for storing the plurality of vectors, respectively; and
  each unit-vector unit comprises a plurality of transistors which are electrically coupled between a power supply terminal and a ground terminal so as to accord with the respective values of segment vectors constituting a vector stored in the unit-vector unit.

12. The error detection circuit according to claim 10, wherein each of the plurality of operation units is configured to perform an error detection operation on a portion of data which has numbers identical to those of segment vectors having a value of "1" among the segment vectors constituting the vector provided to the operation unit.

13. The error detection circuit according to claim 10, wherein the unit interval is determined with respect to a data strobe signal DQS.

14. A data processing apparatus comprising:
  a storage unit;
  a data processing control unit configured to control data write/read operations with respect to the storage unit;
  an error detection circuit configured to generate an error detection code by perform an error detection operation on data using a plurality of vectors;
  a plurality of first global lines configured to transmit the data to the data processing control unit; and
  a plurality of second global lines configured to transmit a portion of the data to the error detection circuit.

15. The data processing apparatus according to claim 14, wherein the data processing control unit is configured to generate and provide an error alert signal to an external device when the error detection code has a value which defines an error occurrence.

16. The data processing apparatus according to claim 14, further comprising an interface unit for generating parallel data by parallelizing serial data provided from an exterior.

17. The data processing apparatus according to claim 14, wherein the portion of the parallel data corresponds to unit data inputted in units of unit intervals.

18. The data processing apparatus according to claim 14, wherein the error detection circuit comprises:
  a vector storage unit configured to store the plurality of vectors;
  a vector switching unit configured to sequentially shift the plurality of vectors on the basis of numbers and to output shifted vectors as many as a predetermined number according to the unit interval; and
  a plurality of operation units configured to output an error detection code in response to the data and each of vectors provided from the vector switching unit.

19. The data processing apparatus according to claim 14, wherein the error detection circuit comprises:
  an error operation unit configured to output the error detection code in response to a plurality of control signals, the plurality of vectors and the data;
  a vector storage unit configured to store the plurality of vectors; and
  a vector switching unit configured to provide the plurality of vectors to the error operation unit in response to the plurality of control signals.

20. The data processing apparatus according to claim 19, wherein the plurality of control signals are generated with respect to a data strobe signal DQS which defines an input timing of the data.

* * * * *